United States Patent [19]

Feist

[11] Patent Number: 4,523,368
[45] Date of Patent: Jun. 18, 1985

[54] SEMICONDUCTOR DEVICES AND MANUFACTURING METHODS

[75] Inventor: Wolfgang M. Feist, Burlington, Mass.

[73] Assignee: Raytheon Company, Lexington, Mass.

[21] Appl. No.: 602,280

[22] Filed: Apr. 24, 1984

Related U.S. Application Data

[63] Continuation of Ser. No. 126,787, Mar. 3, 1980.

[51] Int. Cl.³ .................................... H01L 21/265
[52] U.S. Cl. ..................... 29/571; 29/576 B; 29/578; 148/1.5; 357/23.1
[58] Field of Search ............ 29/571, 576 B, 578, 29/579; 148/1.5, 187; 357/4, 23

[56] References Cited

U.S. PATENT DOCUMENTS

| | | | |
|---|---|---|---|
| 3,739,237 | 6/1973 | Shannon | 29/571 X |
| 3,790,411 | 2/1974 | Simms et al. | 148/1.5 |
| 3,928,082 | 12/1975 | Schwettmann et al. | 148/1.5 |
| 4,025,364 | 5/1977 | Smith | 148/1.5 |
| 4,173,063 | 11/1979 | Kniepkamp et al. | 29/571 |
| 4,232,439 | 11/1980 | Shibata | 29/576 B X |

FOREIGN PATENT DOCUMENTS

| | | |
|---|---|---|
| 1060731 | 3/1967 | United Kingdom . |
| 1155578 | 6/1969 | United Kingdom . |
| 1246208 | 9/1971 | United Kingdom . |
| 1289740 | 9/1972 | United Kingdom . |
| 1289786 | 9/1972 | United Kingdom . |
| 1327597 | 8/1973 | United Kingdom . |
| 1355806 | 6/1974 | United Kingdom . |
| 1435589 | 5/1976 | United Kingdom . |
| 1465244 | 2/1977 | United Kingdom . |
| 1480412 | 7/1977 | United Kingdom . |
| 1507091 | 4/1978 | United Kingdom . |
| 2005073A | 4/1979 | United Kingdom . |
| 2026240A | 1/1980 | United Kingdom . |
| 2052155A | 1/1981 | United Kingdom . |
| 2052155B | 4/1983 | United Kingdom . |
| 2052858B | 7/1983 | United Kingdom . |
| 2063561B | 10/1983 | United Kingdom . |

Primary Examiner—Brian E. Hearn
Assistant Examiner—David A. Hey
Attorney, Agent, or Firm—Richard M. Sharkansky; Joseph D. Pannone

[57] ABSTRACT

A field effect device having a gate over a portion of a surface of a semiconductor disposed between a source region and a drain region and including a buried doped region having a conductivity type opposite the conductivity type of the semiconductor formed in the semiconductor under, and spaced from such portion of the surface of the semiconductor. The buried doped region is electrically connected to the gate electrode. With such arrangement a field effect device is formed with a connecting channel having a shallow depth in the semiconductor between the gate and the buried doped layer. A method for fabricating field effect devices is also disclosed, such method including the step of forming a pair of masking surfaces of insulating material on the surface of the semiconductor. An ion implantation masking layer is formed between the pair of masking surfaces to enable the selective implantation of particles in the semiconductor to establish the source and drain regions. With such method a single level of masking is used to define the source, drain and gate regions of the device.

5 Claims, 22 Drawing Figures

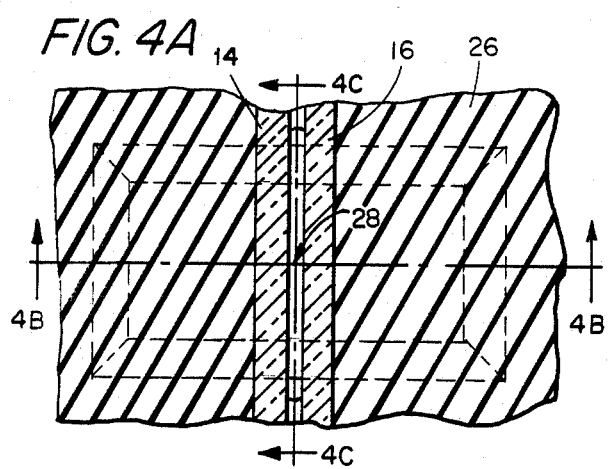
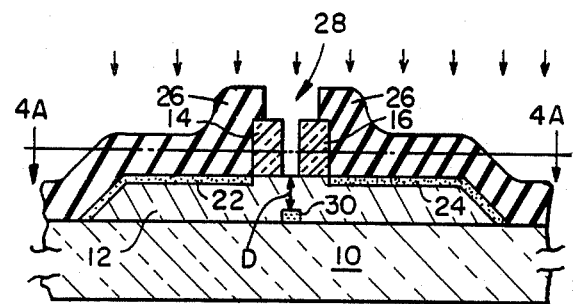
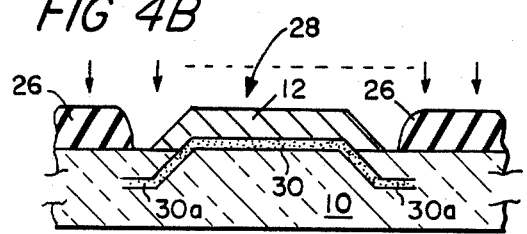
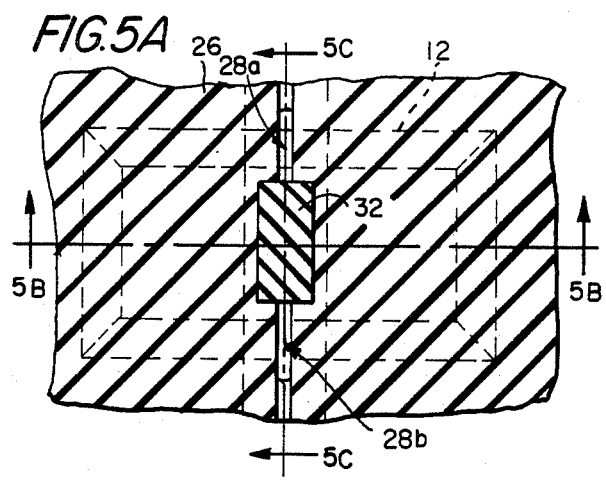
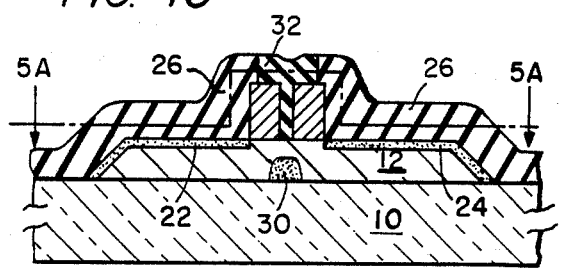
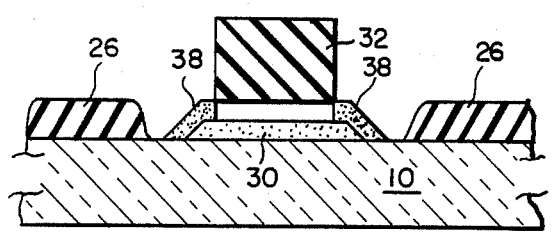
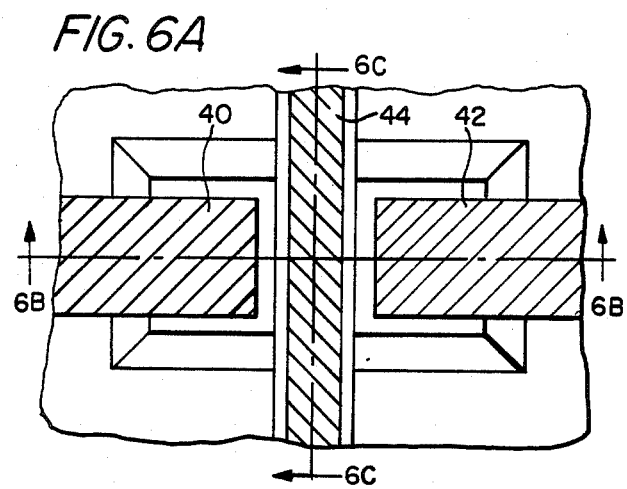
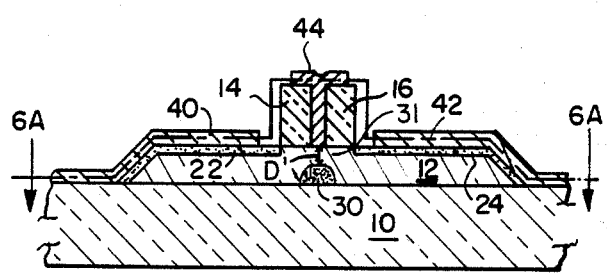
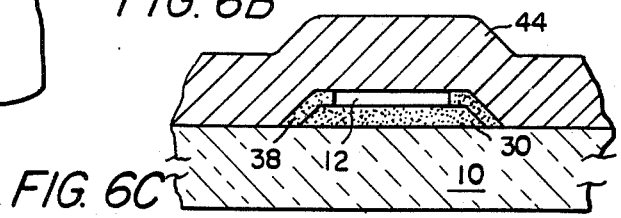

SEMICONDUCTOR DEVICES AND MANUFACTURING METHODS

This application is a continuation of application Ser. No. 126,787, filed Mar. 3, 1980.

BACKGROUND OF THE INVENTION

This invention relates generally to semiconductor devices and manufacturing methods and more particularly to field effect semiconductor devices and manufacturing methods.

As is known in the art, metal gate and junction gate field effect transistors, sometimes referred to as MESFET and JFET devices, have been formed on high resistivity silicon, gallium arsenide, or silicon on sapphire substrates. In order to achieve efficient operation at microwave frequencies in excess of 1 GHz the gate length should be 1 micrometer or less, the gate capacitance should be small, the depth of the conducting channel should be substantially smaller than the length of the gate in order to avoid increasing the effective conductive channel length of the device because of fringing fields, the conductive channel doping should be relatively high, (e.g., $N=10^{17}$ atoms/cm$^3$), the carrier mobility in the conductive channel region should be high to achieve a low on-resistance of the device, the source-drain spacing should be small (e.g. less or equal to 3 micrometers), the contact impedance should be small, and the gate leakage current should be small in order to avoid excessive loading of a drive circuit.

While the requirement of a very shallow conductive channel depth of 0.2 to 0.3 micrometers may be met using gallium arsenide material by forming an appropriately doped, shallow epitaxial layer on an insulating gallium arsenide substrate, and using silicon by an epitaxial or ion implanted layer on a highly resistive single crystal silicon substrate, meeting such shallow channel depth requirement is difficult where the epitaxial layer is of one material, such as silicon, and the substrate is of a different material such as sapphire. That is, complications arise in forming very shallow conductive channel depths for MESFET or JFET devices using silicon on sapphire substrates because of the fact that the electrical properties of the silicon film on the sapphire substrate are generally poor at and near the silicon-sapphire interface. Consequently, while silicon on sapphire devices are theoretically highly desirable since they have greatly reduced parasitic capacitances and readily lend themselves to the fabrication of microwave monolithic integrated circuits, when such devices utilize the full thickness of the silicon the minimum thickness of the silicon, and hence the minimum thickness of the channel depth, is typically 6000 Å and therefore the depth of such conductive channel is only slightly shorter than the gate length. However, if the conductive channel depth is only slightly shorter than the gate length fringing fields spread, increase the effective gate length of the device, and thereby reduce the operating frequency bandwidth of the device.

As is also known in the art, devices of the type described above are generally made by positioning a gate, 1 micrometer or less in width, with a very high degree of masking accuracy precisely between the source and drain regions, which are typically spaced 3 micrometers apart. This is a particularly difficult task, especially if the device is shaped so that registration in two dimensions must be achieved, e.g. in an interdigitated structure. Such technique is usually a so-called "lift-off" technique where a layer of photoresist is deposited on the surface of the semiconductor and patterned to expose the gate of the semiconductor region. Metal is then deposited over the photoresist and onto the exposed gate region. The photoresist with metal on its surface is then lifted off to leave the metal gate on the semiconductor. Such technique may be useful in some applications. However in those applications where it is desired to form a Schottky contact using a platinum deposition and a high temperature process to form platinum-silicide prior to deposition of an aluminum metal gate contact, the photoresist is not generally capable of withstanding such high temperature process thereby limiting the use of this "lift-off" technique.

SUMMARY OF THE INVENTION

In accordance with the present invention a field effect device is provided wherein a gate is disposed over a portion of the surface of a semiconductor between a source region and a drain region and a buried doped region having a conductivity type opposite the conductivity type of the semiconductor is disposed in the semiconductor under, and spaced from the portion of the surface of the semiconductor. In a preferred embodiment of the invention the semiconductor is disposed on an insulating substrate, preferably a semiconductor of silicon on a sapphire substrate. A region in the semiconductor disposed between the gate and the buried doped region provides the conductive channel for the device. In a preferred embodiment of the invention the buried doped region is formed by implanting particles through the surface of the semiconductor and during subsequent heating processes the separation between the portion of the surface of the semiconductor disposed over the conductive channel and the buried doped region is controlled to provide a desired, very shallow conductive channel depth. With such arrangement a shallow conductive channel depth silicon on sapphire device having the conductive channel spaced from the silicon-sapphire interface to obtain increased operating bandwidth is provided.

In a preferred embodiment of the invention a pair of spaced, masking surfaces, preferably thick, insulating strips, are formed on the surface of the semiconductor. A mask is deposited between the spaced insulating strips. Particles are introduced into unmasked surface portions of the semiconductor to provide the source and drain regions. The mask is then removed and a complementary mask is then formed to cover the previously unmasked portions of the semiconductor surface and to expose the region of the semiconductor surface between the insulating strips. This complementary mask provides an ion implantation mask and particles capable of establishing a conductivity type opposite the conductivity type of the semiconductor are ion implanted through the exposed portion of the semiconductor into the underlying semiconductor to form the buried doped region of such particles spaced from the exposed portion of the semiconductor surface. An additional mask is formed between a portion of the pair of strips and over a central portion of the semiconductor. Particles capable of establishing the opposite type conductivity of the semiconductor are ion implanted into exposed surface portions of the semiconductor to provide a conductive region along the exposed surface portions of the semiconductor and into exposed portions of the buried doped region. Source and drain electrodes are provided for the source and drain regions. A gate electrode is provided having a first portion thereof disposed on the surface of the semiconductor between the insulating strips, a second adjacent portion thereof disposed on the surface of the insulating strips and a third portion thereof electrically connected to the buried doped region through the conductive region formed along surface portions of the semiconductor.

With such arrangement the gate electrode capacitance is kept to a minimum since the portion of the gate electrode extending beyond the gate region is deposited on the thick insulating strips adjacent to the gate area. In addition, alignments of the gate region with respect to the source and drain regions is facilitated since these regions are defined simultaneously by a single mask made up of a pair of spaced masking surfaces and which allows one level of masking in forming the source, drain and gate regions of the device.

Further, the use of a pair of spaced, thick masking surfaces enables the fabrication of a self-aligned gate MOS structure where, after forming the thick masking surfaces with vertical walls and before or after implanting source and drain contact regions, the gate oxide is grown over the gate area between the spaced masking surfaces. Particles are then implanted at energy levels which place them in a shallow region directly under the thick masking surfaces but at much greater depths in other regions of the semiconductor, including the gate region. Therefore the doping characteristics of the gate region of the semiconductor are retained. The gate electrode is then formed on a thin oxide layer formed in the region between the spaced masking surfaces and the source and drain regions are electrically connected to the gate region by the portions of the ion implanted region which were implanted at a shallow depth in the semiconductor beneath the thick masking surfaces.

BRIEF DESCRIPTION OF THE DRAWINGS

The foregoing features of this invention, as well as the invention itself, may be more fully understood from the following detailed description read together with the accompanying drawings, in which:

FIGS. 1A through 6A are plan views of a field effect device according to the invention at various steps in the manufacture thereof;

FIGS. 1B through 6B are cross-sectional elevation views of the field effect device at various steps in the manufacture thereof, such cross-sectional elevation views being taken along lines 1B—1B through 6B—6B, respectively, in FIGS. 1A through 6A, respectively; and FIGS. 3C through 6C are cross-sectional elevation views of the field effect device at various steps in the manufacture thereof, such cross-sectional elevation views being taken along lines 3B—3B through 6B—6B, respectively, in FIGS. 1C through 6C, respectively;

DESCRIPTION OF THE PREFERRED EMBODIMENTS

Figure 1A:
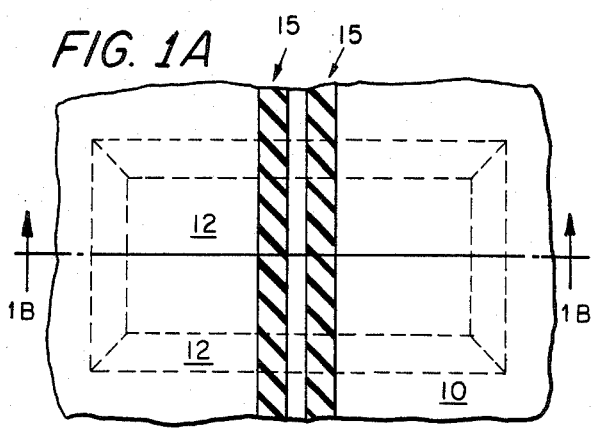
Figure 1B:
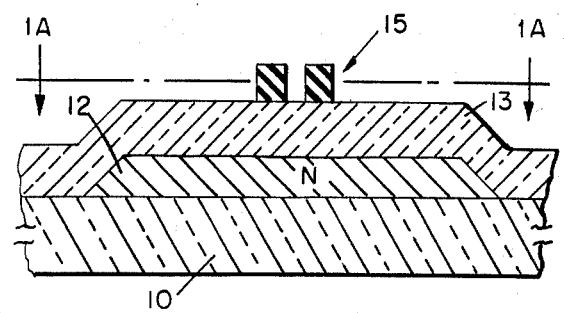

Referring now to FIGS. 1A and 1B, a single crystal insulating substrate 10, here sapphire, having a single crystal semiconductor film 12, here silicon, is shown. The silicon film is here an initially undoped epitaxial layer of silicon having a thickness of 0.5 to 1.5 micrometers. The silicon film 12 is next here implanted with phosphorous (here having a dose range of $N=2$ to $8 \times 10^{12}$ atoms per $cm^2$) through a thin, here 800 Å thick, thermally grown silicon dioxide layer, not shown. The implant damage is then annealed out by heating the substrate, here in argon, for approximately twenty minutes at 1000° C., and at the same time the phosphorous deposit is driven deeper into the silicon film to form an N type conductivity epitaxial layer or film of silicon. The 800 Å thick silicon dioxide layer, not shown, is then photolithographically etched to serve as a mask for forming a mesa structure of silicon in a conventional manner, shown as silicon layer 12 in FIGS. 1A and 1B.

Figure 2A:
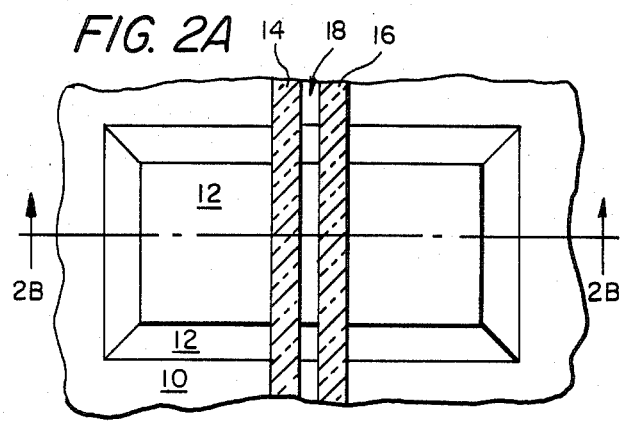
Figure 2B:
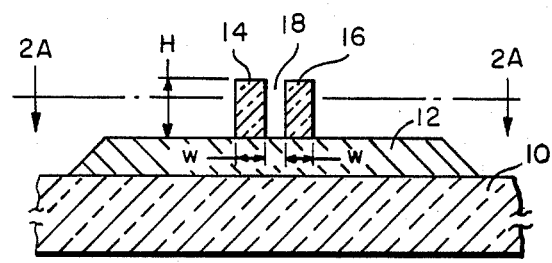

Next, the 800 Å thick silicon dioxide layer is removed and the exposed surfaces of the mesa-shaped silicon layer 12 are oxidized in steam at 850° C. to form a new 800 Å thick insulating layer of silicon dioxide. Thereafter a 1 micrometer to 1.5 micrometer thick layer of silicon dioxide is chemically vapor deposited at 450° C. over the entire structure, the combined silicon dioxide layers being shown in FIG. 1A as layer 13. A photoresist mask 15, is then applied to the surface of this thick silicon dioxide layer 13 and patterned to expose a pair of strip shaped surface portions of the deposited silicon dioxide layer 13. Then this silicon dioxide layer 13 is patterned into silicon dioxide strips 14, 16 (here having a separation of 0.7 to 1.0 micrometers, a height H of 1 to 1.6 micrometers, and each one having a width W of 1.0 to 1.5 micrometers across the mesa structure and portions of the sapphire substrate 10 as shown in FIGS. 2A and 2B using reactive ion etching in a $CHF_3$ atmosphere. When done in a parallel plate ion etching system the silicon dioxide layer 13 is formed into silicon dioxide strips 14, 16 having substantially vertical walls without undercutting the photoresist mask. Because of the vertical etching the relatively small dimensions of the photoresist mask 15 are accurately transferred onto the silicon dioxide layer 13. As will be described hereinafter the pair of silicon dioxide strips 14, 16 are used to provide a pair of masking surfaces during formation of the source region, the drain region, and the gate region, the region 18 disposed between the strips 14, 16 providing a gate window. It is noted that the relative positions of the source, drain and gate regions are defined to a very high degree of accuracy by a single mask, here of photoresist layer 15.

Figure 3A:
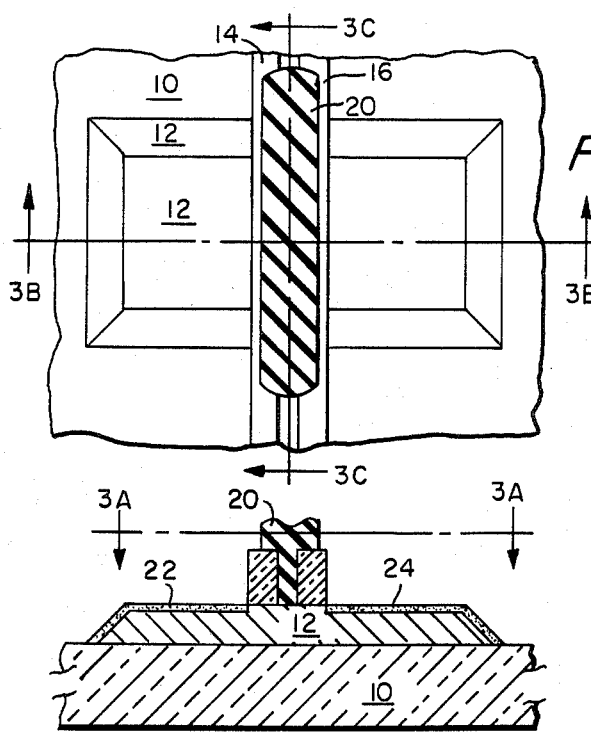
Figure 3B:
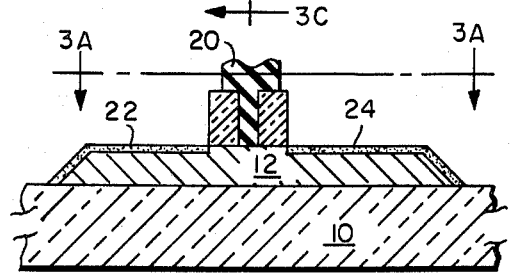
Figure 3C:
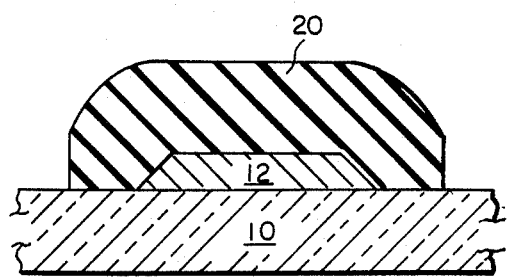

Referring now to FIGS. 3A, 3B, 3C, the region 18 (FIG. 2B) is next covered by a relatively noncritical photoresist mask 20 using conventional techniques. The source and drain regions 22, 24 are formed in the upper exposed surface portions of the silicon film 12, as shown in FIG. 3B, here by ion implanting arsenic or phosphorous with a dose of $N \approx 5 \times 10^{14}$ atoms per $cm^2$ to form N+ type conductivity regions 22, 24.

Referring now to FIGS. 4A, 4B and 4C, the photoresist layer 20 is removed and a photoresist mask 26, complementary to photoresist mask 20 (FIG. 3A) is formed over the structure as shown and is used to provide an ion implantation mask to cover the source and drain regions 22, 24. Boron ions are implanted into the portion of the silicon film exposed by the photoresist mask 26, i.e. into the portion exposed by window 28 to form a buried region 30. The photoresist mask 26 thereby provides a cover or mask to shield such source and drain regions 22, 24 against the deep boron implant. The buried region 30 is thus formed in the silicon film 12 beneath the portion of the surface of such silicon film disposed between strips 14, 16 and exposed by a window 28 formed in mask 26. It is noted that the buried region 30 is buried beneath the exposed surface of the silicon film 12 and is separated from such surface a depth D, here ≈5000 Å. Here the boron is implanted into the exposed portion of the silicon film 12 with a dosage of $N \approx 5 \times 10^{13}$ atoms per $cm^2$ at an implantation energy level of 180 KeV. It is also noted that portion 30a of such regions are actually implanted into the sapphire substrate, as indicated, because the silicon film is thinner at the side peripheral portions than in the central, upper portions.

Referring now to FIGS. 5A, 5B and 5C, a photoresist mask 32 is formed over the central surface portion of the silicon mesa, as shown, with the photoresist layer 26 remaining on the structure as shown. That is, the mask 32 covers a portion of the window 28 FIGS. 4A, 4B in mask 26 to expose separated upper and lower portions 28a, 28b of the surface of the silicon film 12, as shown in FIG. 5A. The masks 26, 32 together provide an ion implantation mask. In particular, boron is implanted into upper surface portions of the exposed upper and lower portions 28a, 28b of the silicon film to provide conductive regions 38 which extend over portions of the upper surface and side surfaces of the silicon film 12 and onto electrical connect peripheral portions of the buried region 30, as shown in FIG. 5C.

Any implant damage resulting is then annealed again by heating the structure in argon at 1000° C. During this heating step the implanted boron is activated to form a p-type conductivity region. The p-type doped regions diffuse into the silicon film 12 and, in particular, the portion of the p-type doped region beneath the silicon surface, i.e. region 30, diffuses towards the upper outer surface of the silicon film 12. The heating is terminated when the depth of the junction between buried region 30 and the silicon film 12 has moved to a depth D', equal to the desired conductive channel depth, here 2000 to 3000 Å below such outer surface as shown in FIG. 6B. It is noted that the channel depth D', here 2000 to 3000 Å is much smaller than the gate length, here 7000 to 10,000 Å with the conductive channel region 31 being disposed between the upper surface of the silicon film 12. It is further noted that the buried region 30 is spaced from the silicon film 12—sapphire substrate 10 interface and hence such conductive channel region 31 is in the portion of the silicon film 12 having good electrical characteristics.

Referring now to FIGS. 6A, 6B and 6C, source and drain electrodes 40, 42 are formed in ohmic contact with the source and drain regions 22, 24, respectively, using conventional techniques. A gate electrode 44 is formed with a Schottky contact to the portion of the surface of the silicon film disposed between silicon dioxide strips 14, 16, as shown. It is noted that such gate electrode 44 is in ohmic contact with the p-type doped regions 38 and hence is electrically connected to the buried p-type buried doped region 30 as shown in FIG. 6C.

Here the gate electrode 44 is formed by first depositing a layer of platinum, not shown, heating such platinum to form platinum silicide in the gate region, removing the remaining portions of the platinum layer and then depositing a titanium-tungsten layer followed by an aluminum layer all in accordance with well known practice to form a Schottky barrier contact.

Because of the use of a pair of relatively thick masking surfaces, i.e. because of the use of insulating silicon dioxide strips 14, 16 (FIG. 2B), it has been found that it is possible to confine the gate metallization entirely to the narrow gate region even through the photoresist mask for the gate metal may be somewhat wider than the gate length. This is accomplished by using photoresist of relatively low viscosity. When this is spun on at sufficient speed, the photoresist layer is correspondingly thin. Because of the vertical and deep silicon dioxide strips 14, 16 adjacent to the gate region, photoresist is drained into the narrow space between the strips 14, 16 forming a thicker coating over the gate, and a very thin or discontinuous coating on the surface of the thick silicon dioxide strips. When the metal is etched, the thin portion of the photoresist coating offers little protection, and thus the metal overlap on the surface of the strips is automatically removed but the metal between the strips is additionally protected by the drained photoresist.

Instead of platinum silicide, other methods can be used to form Schottky barriers. One consists of simply depositing aluminum, silicon doped aluminum, Ti-W-Al, or CrAu onto the bare silicon in the gate region. A more reliable Schottky contact offering a reduced leakage current can be made by first forming a very thin oxide layer, 20–60 Å thick, on the silicon before deposition of the metal. This thin oxide layer can be formed conveniently in an oxygen plasma, or by thermal oxidation (e.g. in steam at 500°–600° C.). In another variation of gate formation a very shallow p-n junction may be formed instead of a Schottky barrier to provide a JFET device.

The device described in this disclosure is also suitable for enhancement type MESFET's or JFET's. To this end, the depth of the channel region is made sufficiently shallow, and the doping of the active channel region is made sufficiently light so that the channel is depleted at zero applied gate voltage on account of the contact potential between the gate and the n-type channel. With the buried region present, the depletion of the channel region is very efficient since it occurs from two sides.

Figure 7A:
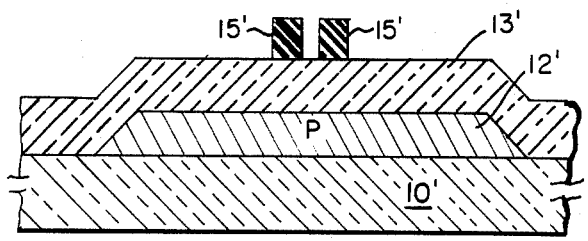
FIGS. 7A to 7F are plan views of a MOSFET device according to an alternative embodiment of the invention at various stages in the manufacture thereof.
Figure 7B:
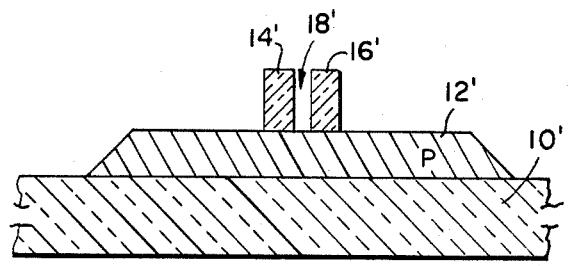
Figure 7C:
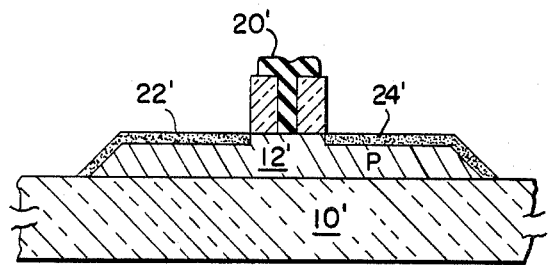
Figure 7D:
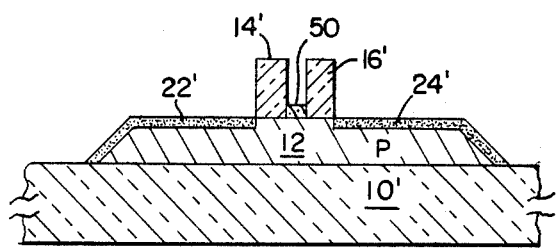
Figure 7E:
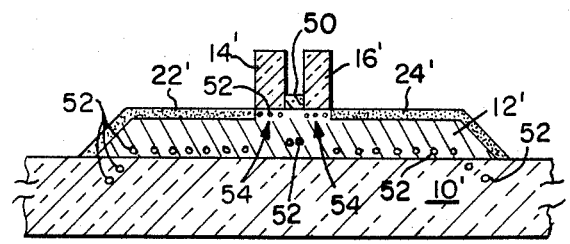
Figure 7F:
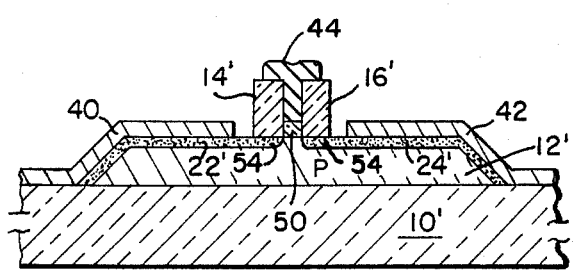

The fabrication method and structure described in this disclosure can be employed to fabricate self-aligned gate MOS structures. Referring to FIG. 7A a p-type conductivity silicon film 12' is shown formed as a mesa type structure on a sapphire substrate 10' as shown using processing techniques described above in connection with FIGS. 1A and 1B. A layer of silicon dioxide 13' is formed over the surface of the structure as shown. A mask is formed of a layer 15' of photoresist as shown in FIG. 7A. A suitable etchant is then brought into contact with the portions of the silicon dioxide layer 13' exposed by the photoresist layer 15' to form a pair of silicon dioxide strips 14', 16' as shown in FIG. 7B. Here such etchant is the reactive ion etching process described above in connection with FIGS. 2A and 2B. As noted above the mask provided by the photoresist layer 15' defines the source, drain and gate regions of the device. Next, a layer 20' of photoresist is disposed in the region between the pair of strips 14', 16' as shown in FIG. 7C. Phosphorous or arsenic ions are then implanted to form the n-type conductivity source and drain regions 22', 24' of the device as shown in FIG. 7C. A gate oxide, here a layer 50 of silicon dioxide, is grown over the surface and then removed except from the portion of the surface over the gate region to provide the structure shown in FIG. 7D. Phosphorous ions 52 are then ion implanted at an energy which puts them into shallow regions 54 of the silicon film 12' located directly under the thick silicon dioxide strips 14', 16' as shown in FIG. 7E. In contrast, since the gate region is covered only by a thin silicon dioxide layer 50, the implant will go deep into the gate region and beneath the source and drain regions 22', 24' as shown. Therefore, the p-type conductivity of the silicon 12' is retained in a region under the gate oxide and it will determine the threshold of the MOSFET. The source, drain and gate electrodes are applied in any conventional manner as shown in FIG. 7F. Having described preferred embodiments of this invention, it is now evident that other embodiments incorporating these concepts may be used. For example, while the devices described herein are silicon on sapphire device a field effect device formed with a buried doped region may be formed on devices made of other materials such as gallium arsenide epitaxial layers formed on semi-insulating gallium arsenide substrates. Further, while the insulating strips are here shown as silicon dioxide strips such may be formed of insulating polycrystalline silicon material. It is felt, therefore, that this invention should not be restricted to the disclosed embodiment but rather should be limited only by the spirit and scope of the appended claims.

What is claimed is:

1. A method of forming a field effect device comprising the steps of:
   (a) forming a pair of spaced insulating members on the surface of a semiconductor;
   (b) forming a masking layer over a region of the surface of the semiconductor between the pair of spaced insulating members;
   (c) introducing particles to establish source and drain contact regions through portions of the surface of the semiconductor exposed by the masking layer;
   (d) removing the masking layer;
   (e) forming a gate electrode over the region between the pair of spaced insulating members.

2. The method recited in claim 1 wherein the semiconductor is silicon and the spaced insulating members are a compound of silicon.

3. A method of forming a field effect device comprising the steps of:
   (a) forming a pair of spaced insulating members on the surface of a semiconductor;
   (b) implanting particles through the members and into the regions of the semiconductor under the pair of spaced insulating members to electrically connect source and drain regions of the device to a gate region disposed under a region of the surface of the semiconductor between the pair of spaced insulating members; and
   (c) forming a gate electrode between the pair of spaced insulating members.

4. A method of forming a field effect transistor having a layer of semiconductor material formed on a surface of a substrate of insulating material with source and drain contact regions formed in upper surface portions of the semiconductor layer and a gate electrode disposed over a portion of such upper surface of the semiconductor layer between the source and drain contact regions comprising the step of forming a doped region buried within a portion of the semiconductor layer disposed beneath, spaced from, aligned with, and electrically connected to the gate electrode.

5. A method of forming a field effect transistor having a layer of semiconductor material with source and drain contact regions formed in upper surface portions of the semiconductor layer and a gate electrode disposed over such upper surface of the semiconductor layer between the source and drain contact regions, such semiconductor layer being formed on an insulating substrate, comprising the steps of:
   (a) forming a doped region buried within a portion of the semiconductor layer disposed beneath, spaced from, and aligned with, the gate electrode; and
   (b) electrically connecting the buried doped region and the gate electrode forming a conductive channel in the portion of the semiconductor between the portion of the upper surface of the semiconductor layer between the source and drain regions and the buried doped layer.

* * * * *

UNITED STATES PATENT OFFICE
CERTIFICATE OF CORRECTION

Patent No. 4,523,368　　　　　　　　　Dated June 18, 1985

Inventor(s) Wolfgang M. Feist

It is certified that error appears in the above-identified patent and that said Letters Patent are hereby corrected as shown below:

Column 5, Line 31: After "region" insert --buried--.

Signed and Sealed this

Seventeenth Day of December 1985

[SEAL]

Attest:

Attesting Officer

DONALD J. QUIGG

Commissioner of Patents and Trademarks